United States Patent [19]

Kamei et al.

[11] Patent Number: 4,481,508
[45] Date of Patent: Nov. 6, 1984

[54] INPUT DEVICE WITH A REDUCED NUMBER OF KEYS

[75] Inventors: Fumio Kamei, Nara; Shigenobu Yanagiuchi, Tenri, both of Japan

[73] Assignee: Sharp Kabushiki Kaisha, Osaka, Japan

[21] Appl. No.: 334,079

[22] Filed: Dec. 24, 1981

[30] Foreign Application Priority Data

Dec. 26, 1980 [JP] Japan ................................ 55-188082

[51] Int. Cl.³ .............................................. G09G 1/00
[52] U.S. Cl. ............................... 340/712; 340/365 VL
[58] Field of Search ................ 340/712, 365 VL, 711, 340/707, 708, 365 C

[56] References Cited

U.S. PATENT DOCUMENTS

| | | | |
|---|---|---|---|
| 3,707,715 | 12/1972 | Perotto | 340/712 |
| 3,757,037 | 9/1973 | Bialek | 340/712 |
| 3,879,722 | 4/1975 | Knowlton | 340/712 |
| 3,956,745 | 5/1976 | Ellis | 340/712 |
| 4,193,119 | 3/1980 | Arase et al. | 340/712 |
| 4,280,121 | 7/1981 | Crask | 340/712 |
| 4,303,916 | 12/1981 | Hakaridani et al. | 340/712 |
| 4,313,108 | 1/1982 | Yoshida | 340/712 |

Primary Examiner—Marshall M. Curtis
Attorney, Agent, or Firm—Birch, Stewart, Kolasch & Birch

[57] ABSTRACT

An input device for use in an electronic apparatus has keys for introduction of information and a display for displaying information which may be introduced by the keys. A display control displays sequentially a predetermined number of characters such as alphabetic information numerical digits or "kana" information. A key corresponds to each displayed character and an input control receives an input information the corresponding character displayed on the display when the respective one of the keys is actuated, and supplies the information to an internal circuit of the apparatus. The device provides input of varied information with a reduced number of input keys.

5 Claims, 3 Drawing Figures

| CHA | CHA CODE |
|---|---|
| A | 0 0 1 0 0 0 0 0 |
| B | 0 0 1 0 0 0 0 1 |
| C | 0 0 1 0 0 0 1 0 |
| D | 0 0 1 0 0 0 1 1 |
| E | 0 0 1 0 0 1 0 0 |
| ⋮ | ⋮ |
| Y | 0 0 1 1 1 0 0 0 |
| Z | 0 0 1 1 1 0 0 1 |
| ア | 0 1 0 0 0 0 0 0 |
| イ | 0 1 0 0 0 0 0 1 |
| ウ | 0 1 0 0 0 0 1 0 |
| エ | 0 1 0 0 0 0 1 1 |
| オ | 0 1 0 0 0 1 0 0 |
| カ | 0 1 0 0 0 1 0 1 |
| ⋮ | ⋮ |
| 0 | 1 0 0 0 0 0 0 0 |
| 1 | 1 0 0 0 0 0 0 1 |
| ⋮ | ⋮ |
| 9 | 1 0 0 0 1 0 0 1 |

F I G. 3

INPUT DEVICE WITH A REDUCED NUMBER OF KEYS

BACKGROUND OF THE INVENTION

This invention relates to an input device for introduction of numeric, alphabetic or "kana" character information and other varied kinds of character information.

In devices such as an electronic solid-state translator or dictionary, the variety of characters to be entered in addition to numeral values, causes a problem by increasing the size or cost of the apparatus.

OBJECTS AND SUMMARY OF INVENTION

Accordingly, it is an object of the present invention to provide a solution to the above problem in the form of a new input device capable of introducing varied sorts of information such as alphabet characters or "kana" characters with a reduced number of keys.

It is another object of the present invention to provide an input device capable of introducing desired characters which as displayed on a display device and selected upon viewing the display device.

According to the present invention, the above objects are achieved by providing a key input device for use in an electronic apparatus for introduction of information and a display for displaying information, which device comprises a display control for permitting said display to display sequentially a predetermined number of characters or items such as numeral information, alphabetic information and "kana" information, a key corresponding to each character or item position on said display, and an input control for receiving as input information displayed on said display when the respective one of said keys is actuated, and for supplying the information to an internal circuit of said apparatus.

BRIEF DESCRIPTION OF DRAWINGS

For a more complete understanding of the present invention and for further objects and advantages therof, reference is now made to the following description taken in conjunction with the accompanying drawings showing a device according to a preferred embodiment of the present invention, in which:

FIG. 3 shows the relationship between characters and character codes.

DETAILED DESCRIPTION OF INVENTION

Figure 1:
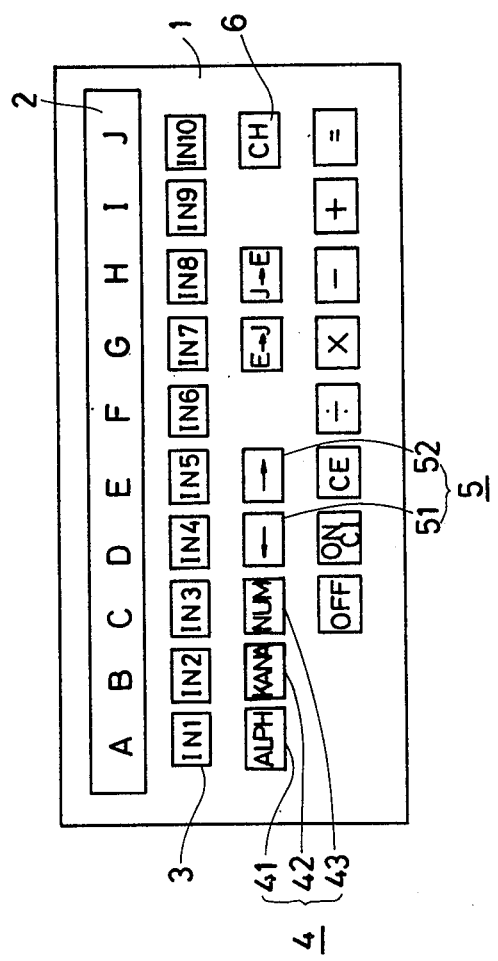
FIG. 1 is a plan view of a portion of an electronic translator with an input device according to the present invention.

Referring now to FIG. 1, there is illustrated an electronic translator having an input device according to the present invention which includes, in a main body 1, a dot-matrix display panel 2, display character selection keys 3, character kind selection keys 4 and display character shift keys 5.

If alphabet character selection key 41 is depressed after power is turned on, a number of alphabetic characters A–J equal to the digit capacity of the display panel 2 (in the illustrated example, 10 digits) are displayed at a time on the panel 2. A left shift key 51 is adapted to shift the information on the display panel 2 to the left by 10 characters whenever depressed. Similarly, a right shift key 52 is used to shift the information on the display panel 2 to the right by 10 digits upon actuation thereof.

If a character sought to be introduced appears on the display panel 2, then the character may be introduced upon actuation of the display character selection key 3 beneath the subject character. To input a character near the end of the alphabetical order, for example, X, Y or Z, the characters A–J are substituted by K–T upon one actuation of the left shift key 51 and then substituted by U–Z upon further actuation of the left shift key 51. Under similar circumstances, the display panel 2 shows K–T upon one actuation of the left shift key 51 and A–J again upon actuation of the right shift key 52. Input procedure is sped up by shifting the character information (about ten characters) to the left or right in the above manner.

When the display panel is placed into "kana" character mode upon actuation of a "kana" character key 42, the display panel shows a total of 10 characters in a "a" column and a "ka" column. Upon subsequent actuation of the right shift key 52 the display panel shows characters in "na" column and "ha" column, and subsequently characters in "sa" and "ta" columns. Numeral information may also be introduced when the above procedure is followed upon actuation of a numeral selection key 43.

Figure 2:
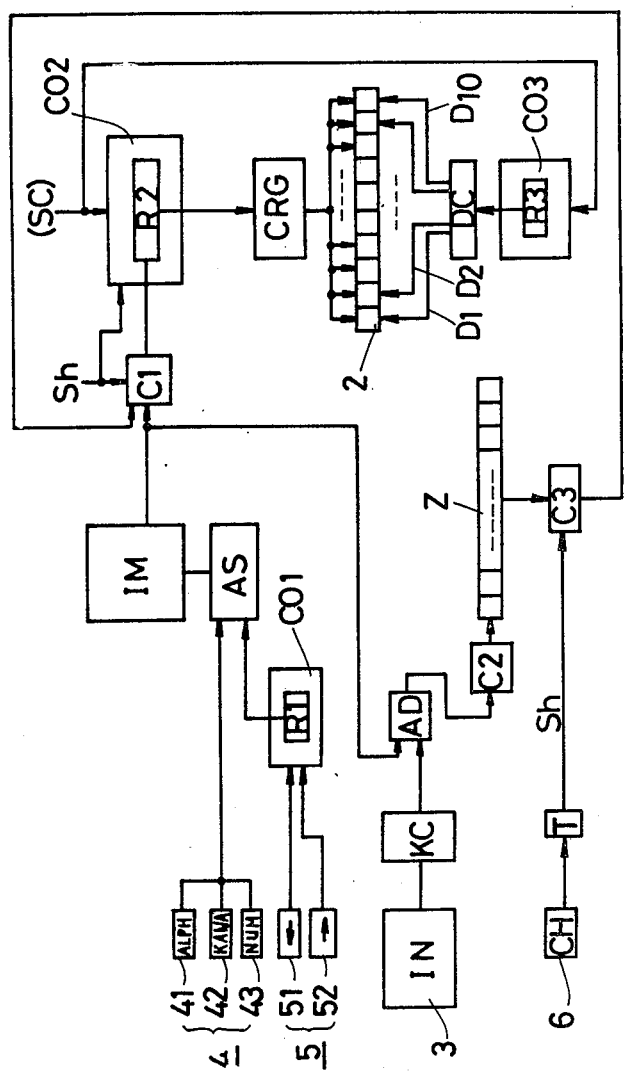
FIG. 2 is a block diagram of the input device of FIG. 1 according to the present invention.

FIG. 2 is a block diagram of an electronic circuit implementing the input device as illustrated in FIG. 1 and FIG. 3 is a view showing the relationship between characters and character codes.

A counter CO 1 counts up or down in response to actuation of one of the shift keys 5 and a register R 1 is contained in the counter CO1. A character code memory IM is adapted to previously store character codes representative of respective characters including "a", "sa", "na", "A", "K" and "U" which are alternately displayed on the left extreme digit position of the display panel. The memory IM has an address control AS which specifies a corresponding address in response to the character kind selection keys 4 and the shift keys 5. The address control AS references the kind of characters as selected by the keys 4. The counter CO1 provides its count representative of the number of actuations of the shift keys 5 to the register R1, while the address control AS determines the address according to the count and the actuated one of the character kind selection keys 4.

For example, when the "kana" key 42 is actuated, there is specified the address where the character code characteristic of "a" is stored (at this time R1 shows "0"). Thereafter, when the left shift key 52 is actuated once, R1 shows "1" and the address is specified which contains the character code of "sa." Upon further actuation of the left shift key 51, R1 bears "2" and the address for the character code characteristic of "na" is selected. When the right shift key 52 is actuated, the counter CO1 counts down so that R1 shows "1" and the address is selected where the character code of "sa" is stored.

A data count circuit CO2 is provided for displaying purposes and includes a register R2 and an input control C1. A character generator CRG generates electrode selection signals for displaying characters upon receipt of the character code from the register R2. A digit selection counter CO3 has its own register R3. A decoder DC is designed to decode the contents of the register R3 and generate digit selection pulses $D_1 \ldots D_{10}$. The data counter CO2 and the digit selection counter CO3 execute counting whenever a synchronizing signal SC is provided.

In an example the character code of "A", "100000", as indicated in FIG. 3, is transferred from the memory IM to the register R2. The count of the register R2 is incremented whenever the synchronizing signal SC is provided, thus generating the character codes for "B", "C", etc. shown in FIG. 3. Thus, the character codes change and the corresponding characters appear on the display panel 2. This is true with the "kana" characters and numeral characters.

The character selection keys 3 are designated by IN1, IN2, IN3 . . . IN10 in FIG. 1. When any one of the display character selection keys 3 is actuated, the corresponding key code is fed from the encoder KC to an adder AD. The encoder KC provides the key codes of "0", "1", "2" . . . "9" for the keys IN1, IN2, IN3, . . . IN10, respectively. The adder AD creates the sum of the above key codes and the character code derived from the memory IM and loads the sum into an input register Z associated with the electronic device. The input register Z has an input control C2.

If the key IN3 is actuated under the situation as depicted in FIG. 1, then the input register Z is loaded with the character code characteristic of the character "C", that is, the sum of the output code from the memory IM (namely, the character "A") and "2." For the remaining character selection keys 3, the same procedure is carried out in a manner to load the character codes characteristic of the character currently displayed above that actuated key. A display conversion key 6, when being actuated, places a T-type flip flop T into set state and generates a display control signal Sh. In response to this signal Sh the contents of the input register Z are displayed on the display panel 2 via the output control C3, the input control C1 of the register R2 and the register R2. When this occurs, the data counter CO2 performs no counting. Upon further actuation of the display conversion key 6 the T-type flip flop T is reset to interrupt the development of the signal Sh. In other words, the display panel 2 displays alternatively the pattern as shown in FIG. 1 or the previous input each time the display conversion key 6 is depressed.

Whereas the conventional electronic translator or similar device has input keys for each respective character of the alphabetic, "kana" or numeral information, the present invention provides an input device wherein a string of characters (typically, 10 characters) selected from among various kinds of characters is displayed sequentially and the desired ones of the characters are selected while being viewed. Therefore, the number of the keys required is reduced to a minimum and the overall apparatus is compact and less costly, Visual confirmation in introducing the varied kinds of the characters obtained by actuating key 6 lessens the possibility of faulty key input operation.

What is claimed is:

1. A compact data input and display device for an electronic apparatus, said device comprising:
   a character display field having a predetermined number of character display positions;
   character selection means for selecting an alphanumeric character type and for displaying a plurality of characters of the selected type in said representative positions of said display field;
   a plurality of input keys equal in number to said predetermined number and corresponding respectively to said positions of said display field;
   means responsive to actuation of any of said input keys for inputting to the electronic apparatus the character displayed in the position of said display field corresponding to the actuated input key; and
   display mode selecting means for causing said display field to selectively display exlusively either said selective type of characters or data previously input to said electronic apparatus.

2. A device as in claim 1, further including display shifting means for shifting the display of characters of selected type for displaying different characters of said selected type.

3. A device as in claim 2, wherein said display shifting means comprises means for selectively shifting said display in opposite senses.

4. A device as in claim 1, comprising:
   character code memory means for storing coded information related to a plurality of types of characters, said character selection means being associated with said character code memory means for selecting code related to characters of the selected type; and
   input register means for receiving data input to said electronic apparatus;
   wherein said display mode selecting means is operative to cause said display field to display either characters represented by code selected from said code memory means or data in said input register means.

5. A device as in claim 1 wherein said character type is alphabetic, kana or numeric.

* * * * *